United States Patent [19]
Song

[11] Patent Number: 5,834,837
[45] Date of Patent: *Nov. 10, 1998

[54] SEMICONDUCTOR PACKAGE HAVING LEADS WITH STEP-SHAPED DIMPLES

[75] Inventor: Chi Jung Song, Daejon, Rep. of Korea

[73] Assignee: LG Semicon Co., Ltd., Cheongju, Rep. of Korea

[ * ] Notice: This patent issued on a continued prosecution application filed under 37 CFR 1.53(d), and is subject to the twenty year patent term provisions of 35 U.S.C. 154(a)(2).

[21] Appl. No.: 775,955

[22] Filed: Jan. 3, 1997

[51] Int. Cl.⁶ .................................................. H01L 23/48
[52] U.S. Cl. ........................... 257/692; 257/666; 257/787
[58] Field of Search ................................ 257/692, 666.3, 257/693, 787, 691, 666

[56] References Cited

FOREIGN PATENT DOCUMENTS

| | | | |
|---|---|---|---|
| 55-71030 | 5/1980 | Japan | 257/692 |
| 1243567 | 9/1989 | Japan | 257/692 |
| 2222568 | 9/1990 | Japan | 257/693 |
| 2271561 | 11/1990 | Japan | 257/692 |
| 2302051 | 12/1990 | Japan | 257/666.3 |
| 4-72654 | 3/1992 | Japan | 257/692 |
| 4129253 | 4/1992 | Japan | 257/787 |
| 4290466 | 10/1992 | Japan | 257/692 |
| 4299565 | 10/1992 | Japan | 257/666.3 |
| 6-177308 | 6/1994 | Japan | 257/693 |

*Primary Examiner*—Mark V. Prenty
*Assistant Examiner*—Nathan K. Kelley
*Attorney, Agent, or Firm*—Fleshner & Kim

[57] ABSTRACT

A semiconductor package includes a semiconductor chip having a plurality of bonding pads, and a plurality of wire contacts; a plurality of leads; a plurality or wires, and a resin molded over the majority of the package. The leads have substrate connecting portions and wire connecting portions. A first side of the substrate connecting portions of the leads connects to the bonding pads on the semiconductor chip. Second sides of the substrate connecting portions of the leads are exposed, i.e., they are not covered with the molding resin. The wires are connected between the wire connecting portions of the leads and the wire contacts on the semiconductor chip. The wire connecting portion of at least one of the leads may be split into at least two branches. In addition, grooves may be formed on the exposed portions of the substrate connecting portions of the leads so that the grooves are engageable with corresponding projections on a device upon which the semiconductor package will be mounted.

6 Claims, 4 Drawing Sheets

SEMICONDUCTOR PACKAGE HAVING LEADS WITH STEP-SHAPED DIMPLES

BACKGROUND OF THE INVENTION

1. Field of the Invention

The present invention relates to a semiconductor package, and more particularly, to an improved semiconductor package which is fabricated by using a lead frame in which a wire connecting unit of a lead is split into plural parts.

2. Description of the Prior Art

As shown in FIG. 1, a bottom lead type semiconductor package (hereinafter, called BLP) according to the conventional art includes a wire connecting unit 2a, a plurality of leads arranged to face each other and each having a substrate connecting unit 2b extendingly bent in a downward direction from the wire connecting unit 2a, and a semiconductor chip provided on the upper surfaces of the substrate connecting units 2b to be attached thereto by a bonder. Bonding pads 1a of the semiconductor chip 1 and the wire connecting units 2a are electrically connected by gold wires 4. Except for the lower surfaces of the substrate connecting units 2B, the semiconductor chip 1, the gold wires 4 and the leads 2 are molded with a molding resin 5.

The fabrication process for the semiconductor package according to the conventional art as described above includes a sawing process for separating a wafer into each individual semiconductor chip 1, a die bonding process for fixingly attaching a separated semiconductor chip 1 on the substrate connecting unit with a bonder such as a double-sided bonding tape, a wire bonding process for electrically connecting the bonding pads 1a on the semiconductor chip 1 and the wire connecting units 2a with metal wires, a molding process for molding the semiconductor chip 1, the gold wires 4 and the lead 2 with a molding resin except the lower surface of the substrate connecting unit 2b, a trim/forming process for cutting a dam bar supporting the chip connecting lead 2a in the lead frame, and a general plating process.

As shown in FIG. 2, in the conventional BLP, the substrate connecting unit 2b of the leads 2 are exposed at the lower surface of the package body formed of the molding compound 5.

A lead frame used in the fabrication of the conventional BLP, as shown in FIG. 3, is formed as a unitary frame, wherein the leads 2 each having a wire connecting unit 2a and a substrate connecting units 2b on which the semiconductor chip 1 is attached with a bonder are supported by dam bars 7 between side rails 6, which are supported by support bars 8 and dam bars 9 connecting the side rails 6.

FIG. 4 shows the leads having the wire connecting units 2a and the substrate connecting units 2b in FIG. 1.

According to the conventional BLP, since the thickness of the molding resin is limited as the size of the semiconductor chip is increased, the area ratio is decreased consequently, and accordingly cracking occurs in inner and outer portions of the package, resulting in lowering the reliability of the semiconductor chip.

Moreover, when the package is mounted on a metal pattern of a printing circuit substrate through the substrate connecting leads exposed at the lower surface, whether the semiconductor package is accurately mounted or not is difficult to ascertain, and if the substrate connecting leads are connected with each other in mounting the package, a short circuit tends to be generated.

Further, there arises an inductance and a noise due to leads being electrically connected with a power supply pad (Vcc) and a ground bonding pad (Vss) of a semiconductor device.

SUMMARY OF THE INVENTION

Accordingly, it is an object of the present invention to provide an improved semiconductor package which is capable of preventing cracking inside and outside the semiconductor package caused by thermal stress.

It is another object of the present invention to provide an improved semiconductor package which is capable of reducing an inductance and noise due to leads being electrically connected with a power supply pad and a ground bonding pad of a semiconductor chip.

It is still another object of the present invention to provide an improved semiconductor package which is capable of maximizing the effect of heat emission, of simplifying alignment during mounting on a printing circuit substrate and of preventing a short circuit.

To achieve the above objects, there is provided an improved semiconductor package which includes a semiconductor chip having first and second surfaces, a plurality of bond pads formed on said first surface; a plurality of leads, each lead including a substrate connecting unit with first and second surfaces, said first surface of said substrate connecting unit being attached to said first surface of said semiconductor chip, and a wire connecting unit extended from said substrate connecting unit, at least one of said wire connecting units having a split wire connecting unit; a plurality of metal wires electrically connecting the semiconductor chip and each wire connecting unit; and molding resin molding said semiconductor chip, a plurality of leads and the metal wires, wherein said second surface of each substrate connecting unit is exposed on an outside surface of said molding resin.

The wire connecting units are split into at least two branches.

A width of said substrate connecting unit of at least one lead is larger than that of the other leads.

A groove is formed on said second surface of at least some of the substrate connecting units.

The grooves are formed in the outermost substrate connecting units located diagonally opposite one another.

The grooves are formed in the outermost substrate connecting units in the leads.

BRIEF DESCRIPTION OF THE DRAWINGS

The present invention will become more fully understood from the detailed description given hereinbelow and the accompanying drawings which are given by way of illustration only, and thus are not limitative of the present invention, wherein:

FIGS. 6A, 6B and 6C are views of the lead frame in FIG. 5, wherein FIG. 6A is a cross-sectional view taken along line VIA—VIA in FIG. 5, FIG. 6B is a cross-sectional view taken along line VIB—VIB in FIG. 5, and FIG. 6C is a cross-sectional view taken along line VIC—VIC in FIG. 5;

DETAILED DESCRIPTION OF THE INVENTION

A semiconductor package according to the present invention will now be described in detail with reference to the accompanying drawings.

Figure 1:
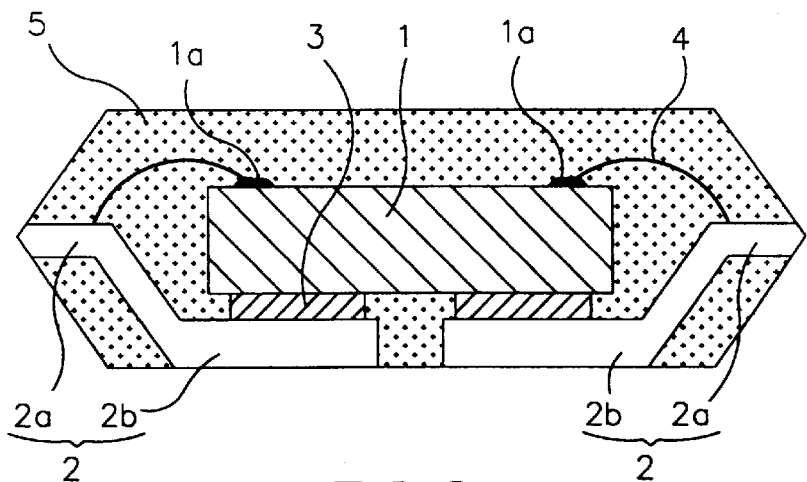
FIG. 1 is a cross-sectional view showing a bottom lead type semiconductor package (BLP) according to the conventional art.
Figure 2:
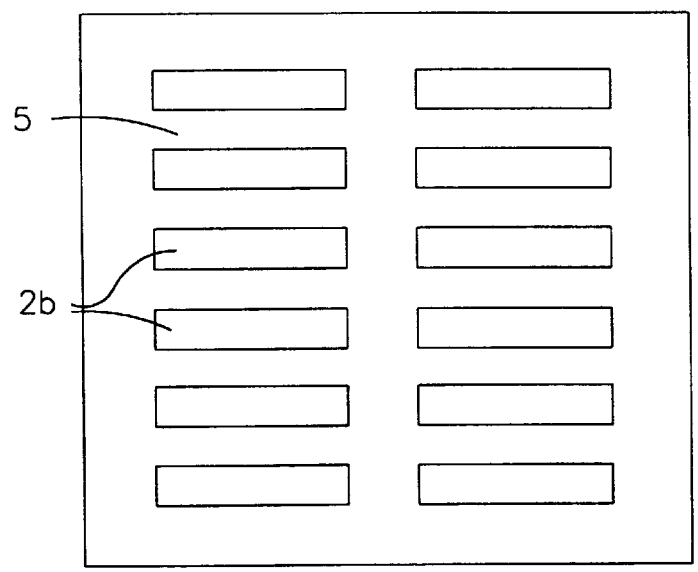
FIG. 2 is a bottom view showing the lower surface of the package of FIG. 1.
Figure 4:
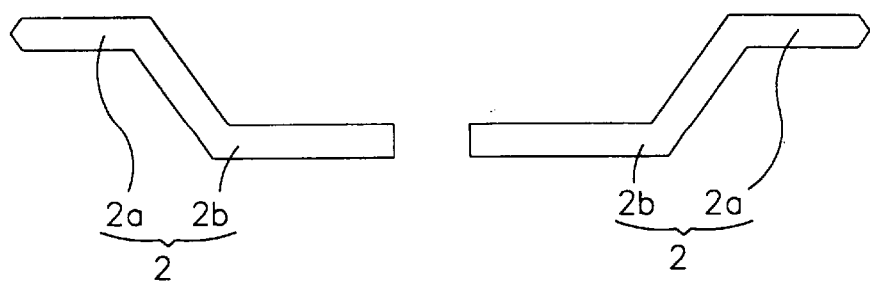
FIG. 4 is a partial cross-sectional view taken along line IV—IV in FIG. 3.
Figure 3:
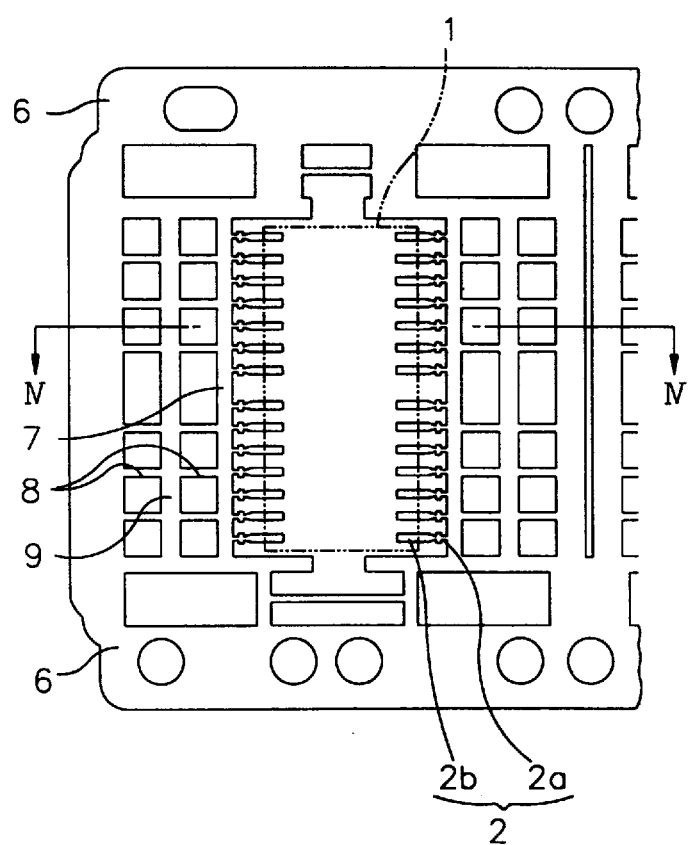
FIG. 3 is a plan view showing a lead frame used in the fabrication of the BLP according to the conventional art.
Figure 5:
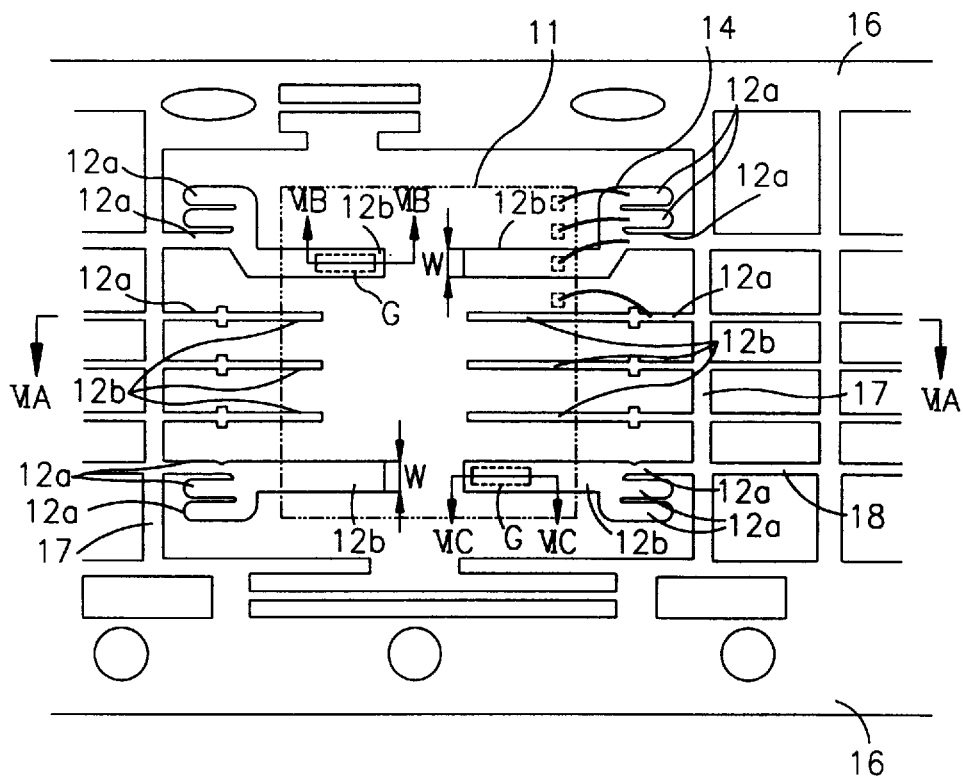
FIG. 5 is a plan view of a lead frame according to the present invention.

As shown in FIG. 5, the construction of a lead frame according to the present invention has a single frame which includes side rails 16 positioned in parallel with one another, more than one dam bar 17 connecting the side rails 16, and a plurality of leads each having a wire connecting unit 12a, one end of which is connected to the dam bar 17, and and from which is extendingly formed a substrate connecting unit 12b. The leads located in the uppermost and lowermost portions have a plurality of leads that are split respectively in upper and lower directions from one side of the wire connecting units 12a so as to reduce the inductance and noise generated accordingly as part of the leads serve as a lead for power supply (VDD) and ground (Vss). According to an embodiment of the present invention, the wire connecting unit 12a of the leads in the uppermost and lowermost portions are formed to be split from another wire connecting unit 12a. In addition, in the leads facing each other in the uppermost and lowermost portions, the width (W) of the substrate connecting unit is larger than that of the substrate connecting units 12b of the other leads, and a groove (G) (shown by a dotted line) is formed in the lower surface of the substrate connecting units 12b. Reference numeral 11 denotes a semiconductor chip fixingly attached on the substrate connecting units 12b of the leads.

Generally, only those leads facing each other in diagonal corners are split into a plurality of wire connecting units 12a to be used as a leads for connecting the power supply pads and the ground pads.

Figure 6A:
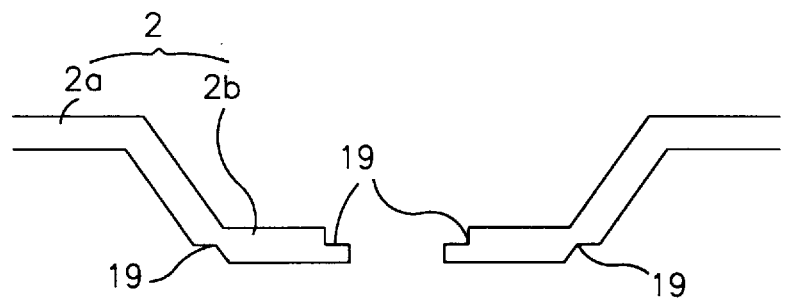

As shown in FIG. 6A, a dimple 19 is formed at an edge of each lead 12 including the wire connecting units 12a and the substrate connecting units 12b and at a predetermined intermediate portion so that a contact region with a molding compound can be increased.

Figure 6B:
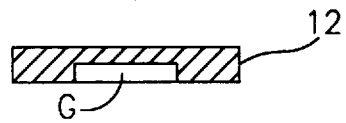
Figure 6C:
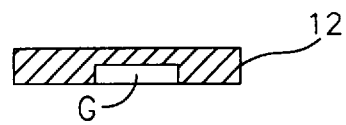

As shown in FIGS. 6B and 6C, a groove (G) is formed in the lower surface of the substrate connecting units 12b in the uppermost and lowermost portions.

Figure 7:
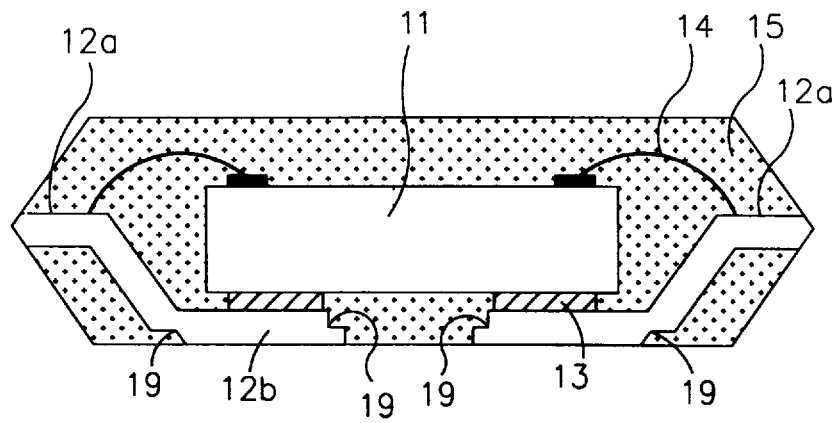
FIG. 7 is a cross-sectional view of a semiconductor package according to the present invention.

As shown in FIG. 7, in a semiconductor package fabricated by using the lead frame according to the present invention, a contact region between the molding compound and the leads is increased due to the dimples 19.

Figure 8:
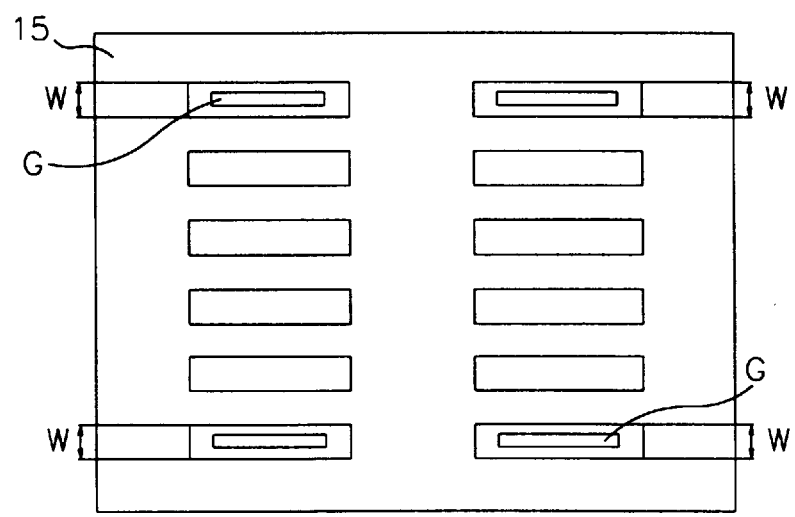
FIG. 8 is a bottom view showing the lower surface of the package of FIG. 7.

As shown in FIG. 8, grooves (G) are formed in the lower surfaces of the substrate connecting units located diagonally opposed in the corners of the lead frame.

As described above, a plurality of wire connecting units of the leads connected to the ground (Vss) pad and the power supply (Vcc) pad are formed by being split, resulting in effectively lowering the inductance and noise caused by the leads and forming a desirable lay out of bonding pads in designing a semiconductor chip.

Moreover, cracking inside and outside the semiconductor package caused by thermal stress can be effectively prevented, by increasing the widths of the substrate connecting units located diagonally opposite each other and by forming dimples at an edge of the leads and at a predetermined intermediate portion to increase the contact area with the molding resin.

Further, since the lower surface of each substrate connecting unit is exposed on the lower surface of the package body, an effect of heat emission can be maximized, and the grooves formed on the lower surfaces thereof prevents a short circuit and an alignment can be made easy in mounting the semiconductor package on a printed circuit substrate.

Although the preferred embodiments of the present invention have been disclosed for illustrative purposes, those skilled in the art will appreciate that various modifications, additions and substitutions are possible, without departing from the scope and spirit of the invention as recited in the accompanying claims.

What is claimed is:

1. A semiconductor package, comprising:

a semiconductor chip;

a plurality of leads having first and second sides, wherein each lead includes a substrate connecting portion and a wire connecting portion, and wherein each lead includes a step-shaped dimple formed at a first end of the substrate connecting portion on the first side of the lead, and a dimple formed at an opposite end of the substrate connecting portion on the second side of the lead;

a plurality of wires connecting the semiconductor chip to the leads; and a molding resin packaging the semiconductor chip, the plurality of leads and the plurality of wires, wherein portions of the second sides of the substrate portions of the leads are exposed.

2. The semiconductor package of claim 1, wherein recesses are formed on the second sides of the substrate connecting portions of leads that are located diagonally opposite one another.

3. The semiconductor package of claim 1, connecting portion of at least one of the leads splits into at least two branches.

4. The semiconductor package of claim 1, wherein the first side of the substrate connecting portion of each of the leads is attached to the semiconductor chip, and wherein the wire connecting portion of each of the leads extends from the substrate connecting portion.

5. The semiconductor package of claim 1, wherein leads that are located diagonally opposite one another have a width that is greater than a width of other leads.

6. The semiconductor package of claim 2, wherein the recesses are rectangularly shaped.

* * * * *